United States Patent
Julien et al.

[11] Patent Number: 6,102,110
[45] Date of Patent: Aug. 15, 2000

[54] TWO-PHASE OR MONO-PHASE HEAT EXCHANGER FOR ELECTRONIC POWER COMPONENT

[75] Inventors: Jean-Noël Julien, La Mure; Jacques Lachise, Vaulx en Velin, both of France

[73] Assignee: Ferraz Date Industries, La Mure, France

[21] Appl. No.: 09/233,156

[22] Filed: Jan. 19, 1999

[30] Foreign Application Priority Data

Jan. 19, 1998 [FR] France .................................. 98 00744

[51] Int. Cl.[7] ..................................................... F28D 15/00
[52] U.S. Cl. ..................................... 165/104.33; 165/80.3; 165/104.26; 165/80.4; 361/385; 361/700; 361/707; 361/699; 174/15.2; 257/715; 257/720; 257/722; 257/714
[58] Field of Search ............................. 165/80.3, 104.26, 165/104.33; 361/385, 386, 702, 700, 707; 174/15.2; 257/715, 720

[56] References Cited

U.S. PATENT DOCUMENTS

| | | | |
|---|---|---|---|
| 4,675,783 | 6/1987 | Murase et al. ........................... | 361/385 |
| 4,777,561 | 10/1988 | Murphy et al. . | |
| 5,014,904 | 5/1991 | Morton ..................................... | 361/386 |
| 5,229,915 | 7/1993 | Ishibashi et al. ................... | 165/104.33 |
| 5,402,160 | 3/1995 | Kadowaki et al. ................. | 165/104.33 |
| 5,879,461 | 3/1999 | Adams ................................... | 165/80.1 |
| 5,959,837 | 9/1999 | Yu ....................................... | 165/104.33 |

FOREIGN PATENT DOCUMENTS

| | | | |
|---|---|---|---|
| 52-59355 | 5/1977 | Japan ................................. | 165/104.33 |
| 5063385 | 3/1993 | Japan . | |
| 7142653 | 6/1995 | Japan . | |
| 1563091 | 3/1980 | United Kingdom . | |
| 545563 | 6/1993 | United Kingdom . | |

Primary Examiner—Ira S. Lazarus
Assistant Examiner—Terrell McKinnon
Attorney, Agent, or Firm—Dowell & Dowell, P.C.

[57] ABSTRACT

A two-phase or mono-phase heat-exchanger for at least one electronic power component wherein the heat-exchanger supports a plurality of heat exchange tubes, each having a heat exchange fluid therein, and wherein said heat-exchanger includes at least one rigid plate provided with zones for receiving portions of the heat exchange tubes and wherein the heat-exchanger includes opposite edges which are formed so as to be secured to edges of adjacent heat-exchangers in such a manner that front and rear surfaces of the at least one rigid plate of each heat exchange unit are coplanar when one heat-exchanger is secured to an adjacent heat-exchanger.

10 Claims, 5 Drawing Sheets

TWO-PHASE OR MONO-PHASE HEAT EXCHANGER FOR ELECTRONIC POWER COMPONENT

BACKGROUND OF THE INVENTION

The present invention relates to a two-phase or mono-phase heat-exchanger for electronic power components.

BRIEF STATEMENT OF THE RELATED ART

Heat-exchangers of this type are necessary in order to avoid damaging overheating of electronic power components such as IGBT (Insulated Gate Bipolar Transistor) circuits or equivalent. A heat-exchanger comprising a plurality of tubes for evaporation/condensation of a heat-exchanging liquid and a block forming a heat-exchange unit with an electronic component is described in European Patent Application 0 417 299. Furthermore, WO-A-95/17765 discloses a heat-exchanger essentially constituted by a plate provided with grooves for receiving tubes for circulation of a heat-exchanging liquid.

Heat-exchangers of this type are generally installed as a bank in order to cool a consequent number of electronic components of various dimensions. In that case, with the known device, it is necessary to provide a chassis supporting the bank of heat-exchangers, which substantially increases the cost of an installation. In addition, in the known devices, the heat-exchange units must be configured as a function of the size and location of the or each component that they must support. This induces the creation of a large number of references of heat-exchange units, rendering manufacture and maintenance of the groups of heat-exchangers more complex.

It is a more particular object of the invention to overcome these drawbacks by proposing a heat-exchanger which may participate in a modular structure without using a chassis. The invention also envisages a heat-exchanger adaptable to different types of components.

SUMMARY OF THE INVENTION

To that end, the invention relates to a two-phase or mono-phase heat-exchanger for at least one electronic power component. The exchanger includes a unit for heat-exchange with the component and a plurality of exchange tubes with a heat-exchanging fluid, the tubes being joined to the heat-exchange unit which is formed by at least one rigid plate provided with zones for receiving certain parts of the tubes, characterized in that the heat-exchange unit is provided, at parallel edges of the or each plate, with means for edge-to-edge assembly with a similar plate belonging to an adjacent exchanger in a group of heat-exchangers, the assembled plates being globally coplanar.

Thanks to the invention, the rigid plate of the heat-exchange unit forms a self-supporting structure for the heat-exchanger, which makes it possible to dispense with the systematic use of a chassis.

According to a first variant embodiment of the invention, the plate includes, on a first edge, a first rabbet and, on a second edge substantially parallel to the first edge, a second rabbet, the first and second rabbets being disposed in opposition, a border of one rabbet extending in line with a first principal face of the plate, while a border of the other rabbet extends in line with a second principal face of the plate.

According to another variant embodiment of the invention, the heat-exchange unit is formed by two connected plates provided with grooves disposed opposite and defining zones for receiving the parts of the tubes forming an evaporator, these plates projecting with respect to one another on two opposite, substantially parallel edges of the heat-exchange unit. In that case, it may be provided that the parts of the plates which project from the opposite plate form the borders of two rabbets disposed in opposition on the edges of this unit.

According to another advantageous aspect of the invention, applicable whatever the embodiment considered, the exchanger comprises means for connecting a first rabbet of a first unit belonging to a first exchanger in fitted position with respect to a second rabbet of a second unit belonging to a second exchanger. This aspect of the invention makes it possible to create a self-supporting structure for an assembly of a plurality of heat-exchangers disposed side by side.

In that case, it may be provided that one border of a rabbet comprises orifices for passage of the locking screw shank and that a border of the other rabbet comprises tappings for receiving the threaded end of these screws.

According to another advantageous aspect of the invention, the plate has, on at least one of its principal faces, means for fixing electronic power components of various shapes and in variable number. This aspect of the invention makes it possible, with the aid of one type of plate, to accommodate several types of electronic components, which makes it possible substantially to reduce the reference number of plates capable of belonging to heat-exchange units with respect to the devices of the prior art. In particular, it may be provided that these fixing means be tappings distributed on at least one of the principal faces of the plate or plates.

BRIEF DESCRIPTION OF THE DRAWINGS

The invention will be more readily understood on reading the following description of three embodiments of a two-phase heat-exchanger in accordance with its principle, given solely by way of example and with reference to the accompanying drawings, in which.

DESCRIPTION OF PREFERRED EMBODIMENTS

Figure 1:
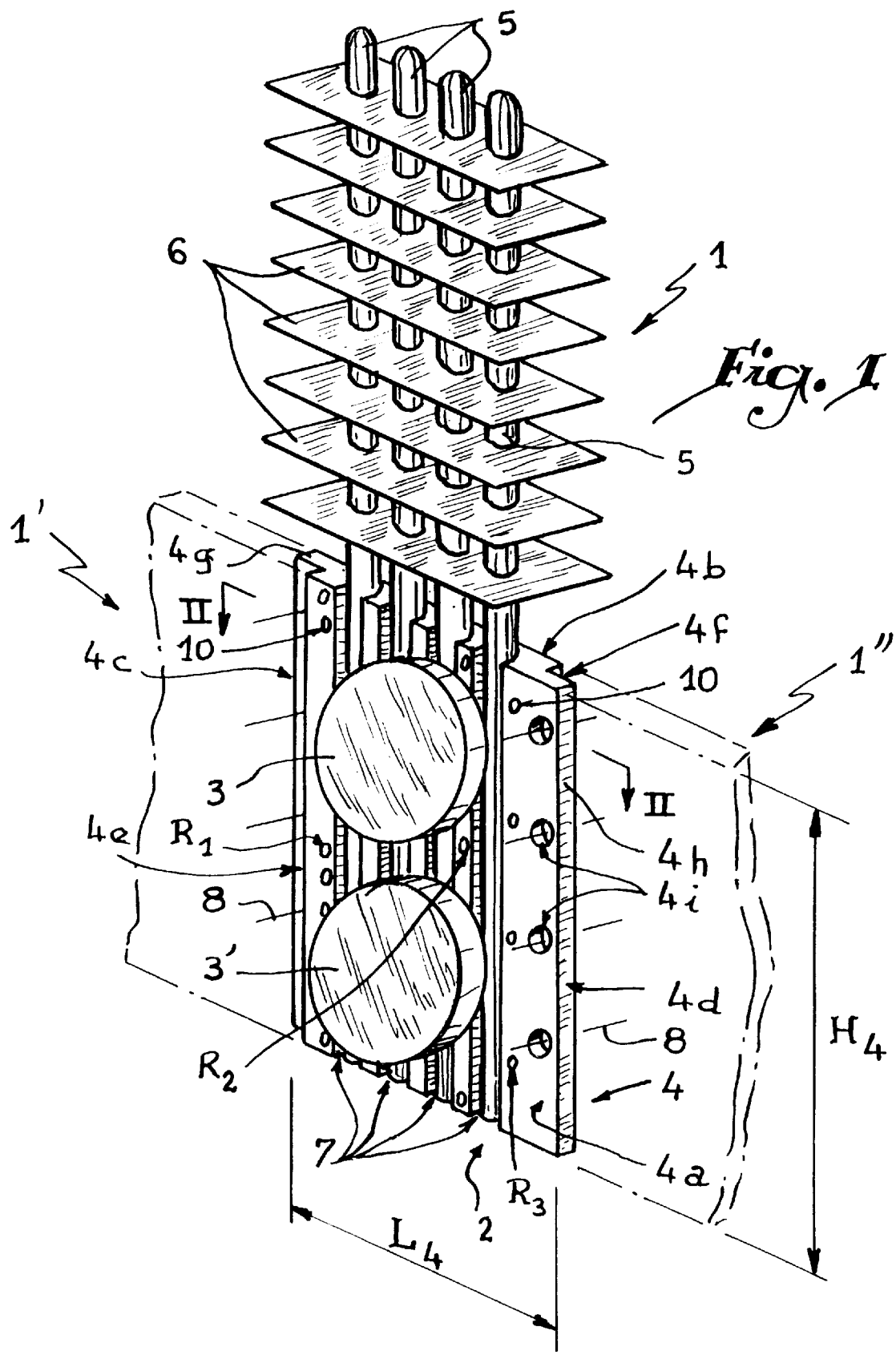
FIG. 1 is a view in perspective of a heat-exchanger according to the invention in an assembly of a plurality of exchangers.

Referring now to the drawings, and firstly to FIG. 1, three identical heat-exchangers 1, 1' and 1" are shown, exchangers 1' and 1" being simply silhouetted in dashed and dotted lines. Heat-exchanger 1 comprises a unit 2 adapted to receive two electronic components 3 and 3' such as IGBT circuits or equivalent. Unit 2 is essentially composed of an aluminium plate 4 on which are connected tubes 5 for evaporation and condensation of a heat-exchanging liquid such as methanol or water. In the part which projects from unit 2, the tubes 5 are provided with cooling fins 6 allowing dissipation of the heat.

The operational principle is as follows: the heat released by components 3 and 3' has for its effect to increase the temperature of the unit 2, this leading to an evaporation of the liquid located in the lower part of the tubes 5 inside parallel grooves 7 for receiving this lower part of the tubes. The vapour formed in the lower part of the tubes circulates upwardly inside each tube 5. As this circulation progresses, and due to the dissipation of the calories through the wall of the tubes 5 and the fins 6, the fluid cools and recondenses, with the result that it redescends along walls of each tube 5 under the effect of gravity. It may then be evaporated again in order to cool the unit 2. 4a denotes that face of the plate 4 on which the components 3 are mounted, and 4b the face of the plate 4 opposite face 4a.

According to a variant of the invention (not shown), electronic components might also be fixed on face 4b of the plate 4.

On the two substantially vertical edges 4c and 4d of the plate 4 which are parallel to each other, the plate includes two rabbets 4e and 4f which are disposed in opposition.

Figure 2:
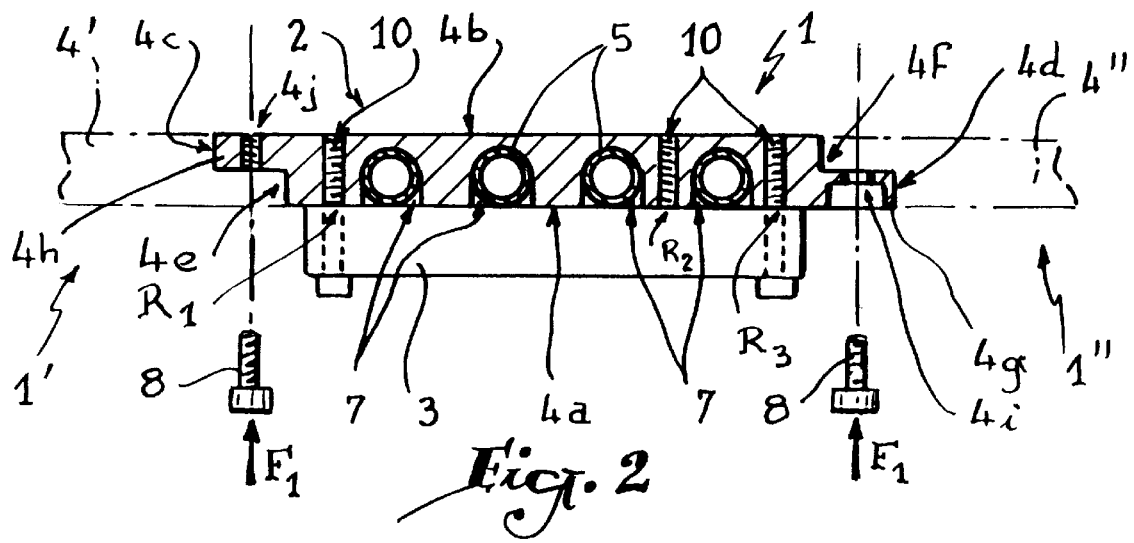
FIG. 2 is a section along line II—II of FIG. 1.
Figure 3:
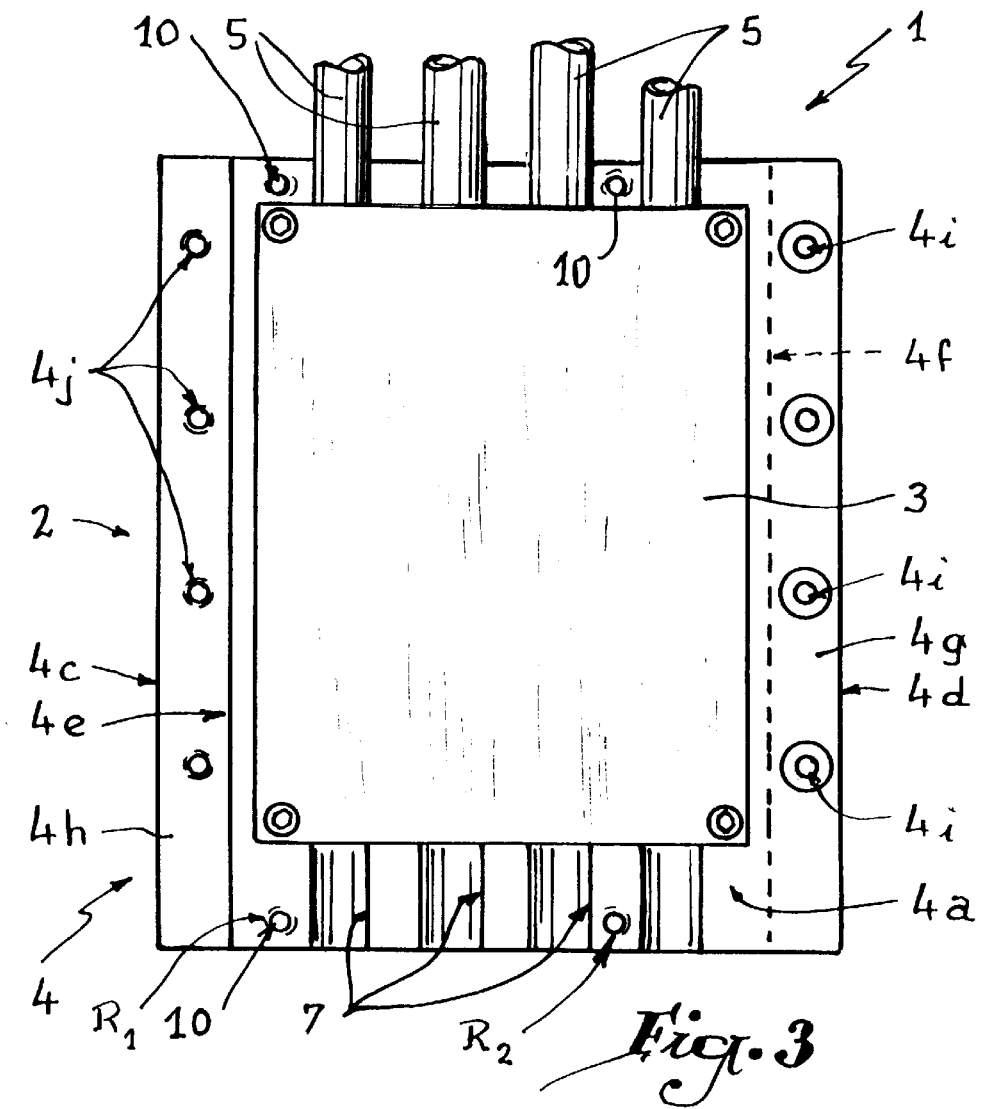
FIG. 3 is a view in elevation of a plate belonging to an exchanger of FIG. 1, on which an electronic component is mounted.
Figure 4:
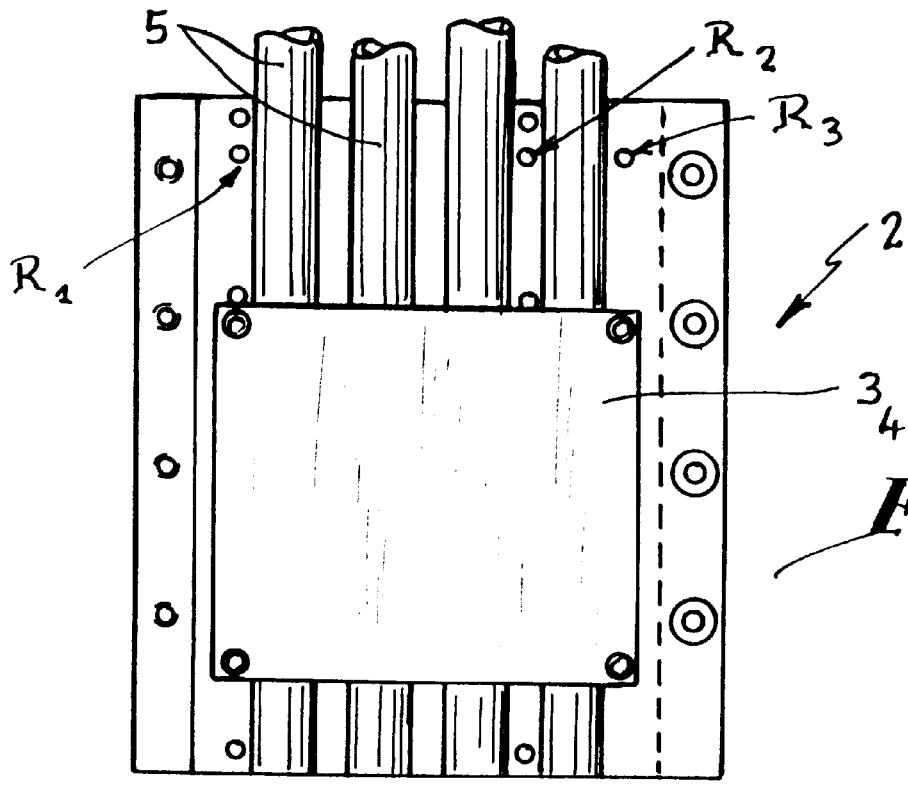
FIGS. 4 to 7 are views similar to FIG. 3, on a smaller scale, on which other electronic power components are mounted.
Figure 5:
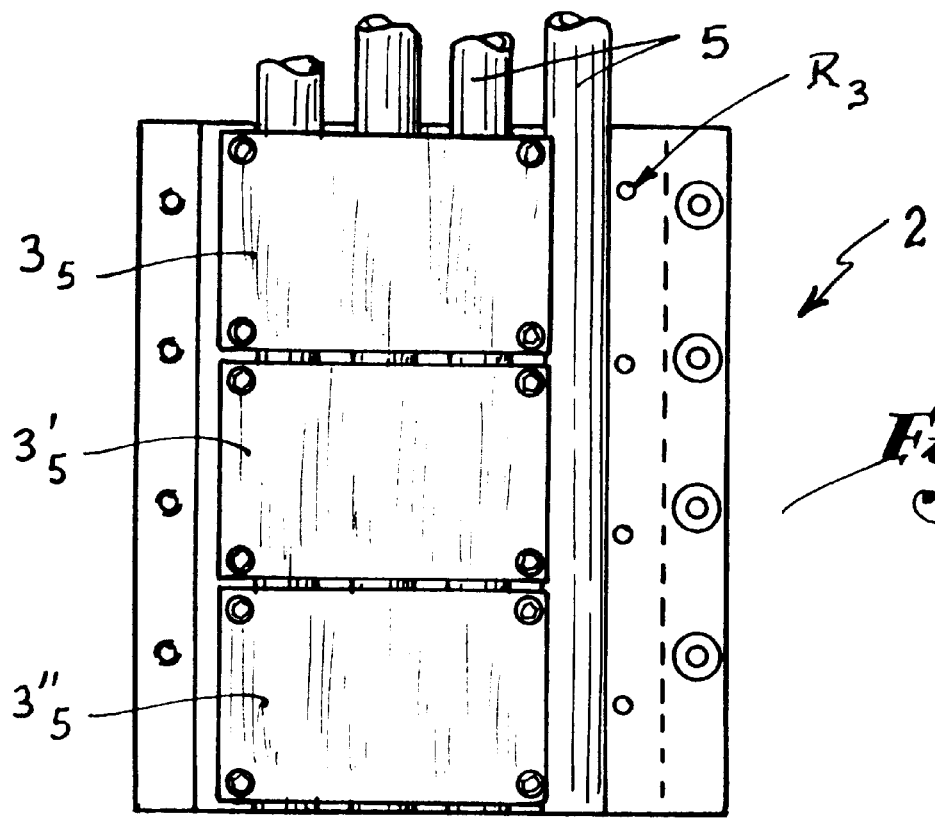
Figure 6:
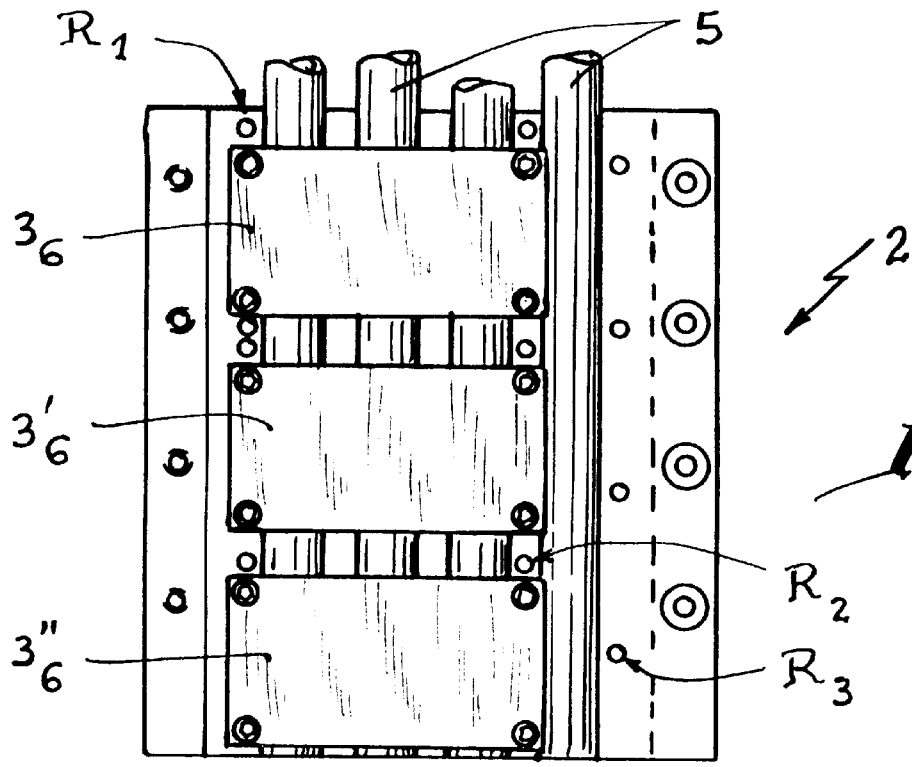
Figure 7:
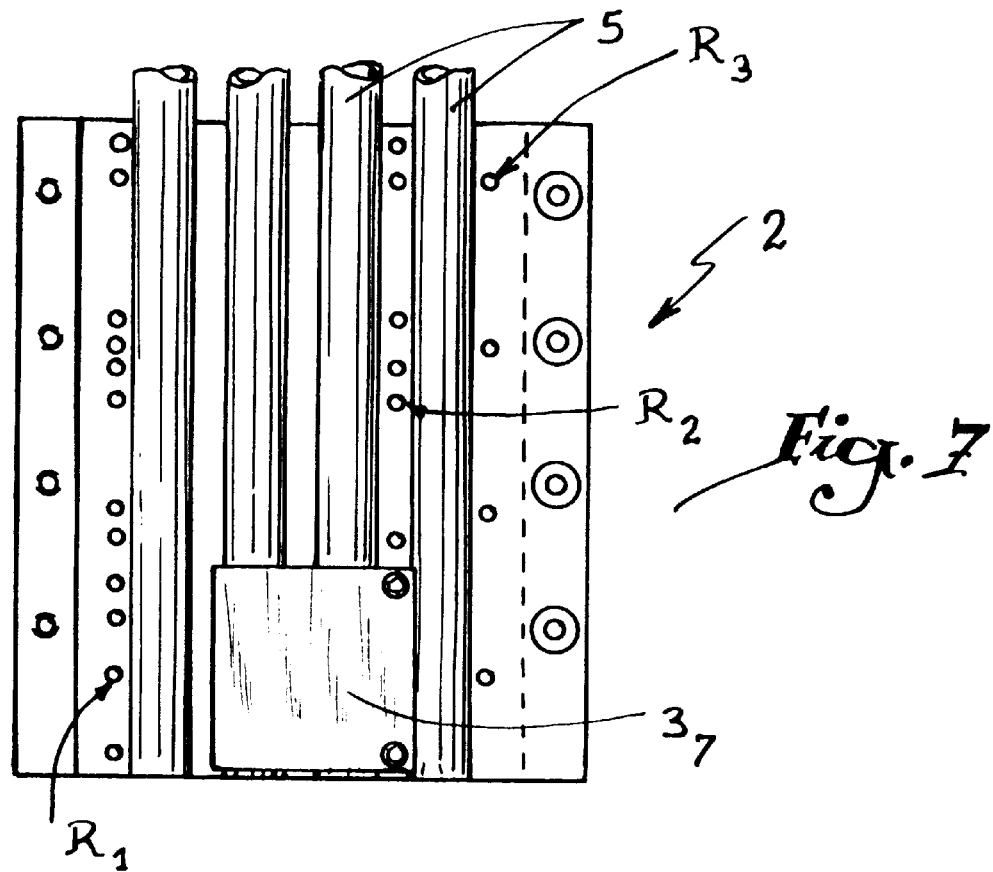

More precisely, the rabbet 4f comprises a border 4g which extends the surface 4a, while rabbet 4e comprises a border 4h which extends the surface 4b. In this way, and as is more clearly visible in FIG. 2, when plates 4 or equivalent are disposed side by side., it is possible to fit rabbet 4e of one plate 4 and rabbet 4f of an adjacent plate 4'. Similarly, rabbet 4f allows assembly with a rabbet similar to rabbet 4 and belonging to an adjacent plate 4". In this positon, locking screws 8, visible in FIG. 2, may be inserted in a series of orifices 4i in the border 4g of rabbet 4f in order that their threaded ends be received in tappings 4j in the border 4h of a rabbet 4e fitted behind the border 4g with respect to the direction of introduction of screws 8, represented by arrow $F_1$ in FIG. 2.

In this way, the rabbets 4e and 4f and screws 8 constitute means for rigid edge-to-edge assembly of the plates 4, which makes it possible to constitute a rigid group of heat-exchangers without using a frame or a chassis. The assembled plates 1, 1' and 1" are coplanar, with the result that tubes 5 and their fins 6 do not interfere with one another.

On its face 4a, plate 4 has three rows of tappings 10, denoted $R_1$, $R_2$ and $R_3$ respectively. Components 3 and 3' are mounted on the plate 4 by introducing fastening screws into certain of the tappings 10. By comparing FIGS. 1 and 3 to 7, it will be understood that tappings 10 make it possible to accommodate components 3, 3', $3_3$, $3_4$, $3_5$, $3'_5$, $3''_5$, $3_6$, $3'_6$, $3''_6$ and $3_7$ of varied shapes and dimensions. In this way, when the width $L_4$ and the height $H_4$ of plate 4 are determined as a function of the dimensions of the exchanger, a single plate may be used for receiving virtually any type of component, it being understood that the components are standardized as to the location of the fastening screws which support them.

Figure 8:
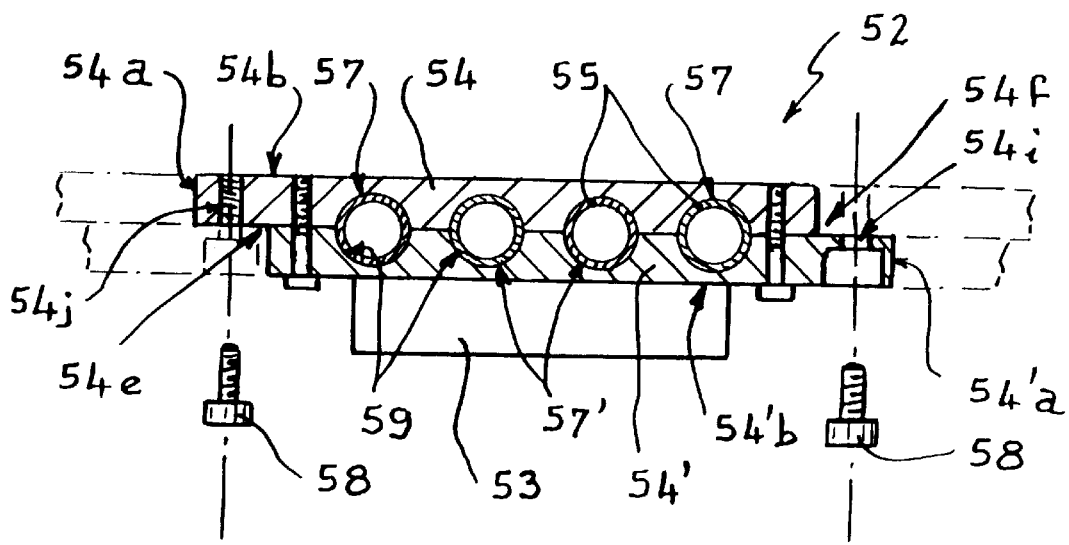
FIG. 8 is a view similar to FIG. 2 for a heat-exchanger in accordance with a second embodiment of the invention.

In the second embodiment of the invention shown in FIG. 8, elements similar to those of the embodiment of the preceding Figures bear identical references increased by 50. In this embodiment, the heat-exchange unit 52 which supports a component 53 is formed by two plates 54 and 54' provided on their opposite face with longitudinal grooves 57 and 57'. Grooves 57 and 57' are disposed opposite one another so as to define housings 59 for receiving the part forming evaporator of the tubes 55 containing a heat-exchanging liquid. Plates 54 and 54' are mounted to project with respect to each other, with the result that an edge 54a of plate 54 is not covered by plate 54', while a second edge 54'a of plate 54' is not covered by plate 54. Edges 54a and 54'a which are opposite and substantially parallel, thus form the borders of two rabbets 54e and 54f, disposed in opposition. Borders 54a and 54'a respectively extend the outer surface 54b of plate 54 and the outer surface 54'b of plate 54'. As in the preceding embodiment, the edges 54a and 54'a are provided with orifices 54i and with piercings 54j for receiving fastening screws 58. This makes it possible to obtain an edge-to-edge assembly of a unit 52 with a similar unit, such assembly being rigid while units 52 or the like are coplanar.

Figure 9:
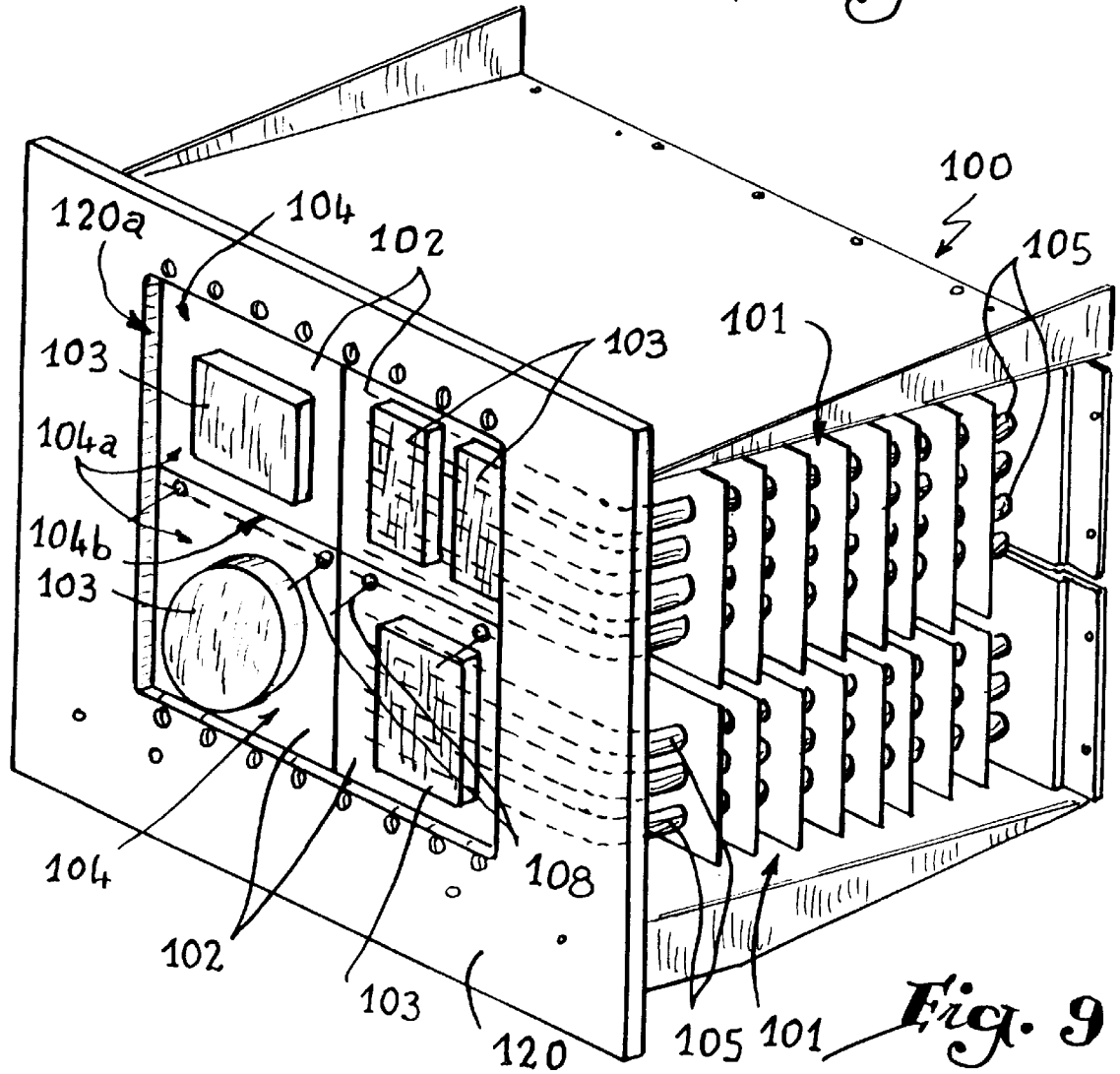
FIG. 9 is a view in perspective of an assembly made with heat-exchangers in accordance with a third embodiment of the invention.

In the embodiment of FIG. 9, elements similar to those of the embodiment of FIGS. 1 to 8 bear identical references increased by 100. The assembly 100 of heat-exchangers 101 shown in FIG. 9 comprises four exchangers mounted on a board 120. These four exchangers each comprise a unit 102 for heat-exchange with electronic components 103 which do not necessarily all have the same dimensions or the same shape. Units 102 are formed by plates 104 of which the face 104a intended to receive components 103 is visible through an opening 120a in board 120. Tubes 105 for evaporation/condensation of a heat-exchanging liquid are disposed in receiving grooves or zones fashioned in plates 104, then bent so that they extend in a direction globally perpendicular to the surfaces 104a over the greater part of their length where they are surrounded by cooling fins 106. The plates 104 are provided, on their edges 104b disposed substantially horizontally in FIG. 9, with rabbets (not shown) which make it possible to assemble them rigidly, in a plane, thanks to fastening screws 108 represented by their lines of axis.

The horizontal edges of opening 120a of board 120 may be equipped with rabbets equivalent to those of the edges of plates 104, with the result that the upper rabbets of the upper plates 104 and the lower rabbets of the lower plates may also be used for fixing the plates on board 120.

Whatever the embodiment considered, tubes 5, 55 or 105 bear in their upper or outer part, fins 6, 106 or equivalent, of which the width is chosen to be substantially equal to that of plate 4, 54, 54' or 104 so as to avoid any interference between the fins of two exchangers disposed side by side and possibly to allow their fastening. Sealing plates may advantageously be disposed between the ribs and the unit 2, 52 or 102 on the one hand, and above the fins on the other hand, these plates having a width substantially equivalent to that of units 2, 52 or 102 and being able to be hermetically assembled together.

The invention has been represented with two-phase heat-exchangers, but it is applicable with mono-phase exchangers in which the heat-exchange tubes contain a fluid present, in the same phase, on the "hot" side and on the "cold" side of each tube.

The invention presented with grooves is applicable with piercings in which are inserted the lower ends of the tubes which are sealed thereon by tin-lead soldering.

What is claimed is:

1. Two-phase or mono-phase heat-exchanger for at least one electronic power component, said exchanger comprising, a unit for heat-exchange with said component and a plurality of heat exchange tubes each containing a heat exchanging fluid, said tubes being mounted in heat exchange relationship to said heat-exchange unit, said unit being formed by at least one rigid plate having opposite front and rear faces and provided with zones for receiving portions of said tubes, wherein said heat-exchange unit includes opposite side edges, said opposite side edges being formed such that one of said opposite side edges of said heat-exchange unit may be rigidly connected to side edges of adjacent heat-exchange units with said front and rear faces of said heat-exchange unit and front and rear faces of the adjacent units being coplanar, and means for securing said opposite side edges of said heat-exchange unit to side edges of the adjacent units.

2. The heat-exchanger of claim 1, wherein a first of said opposite edges of each heat exchange unit is formed by a first rabbet and a second of said opposite edges which is substantially parallel to said first edge is formed by a second rabbet, said first and second rabbets being oriented in opposition, a border of said first rabbet extending in line with said front face of said plate, while a border of said second rabbet extends in line with said rear face of said plate.

3. The heat-exchanger of claim 2, wherein said first rabbet of said heat-exchange unit is configured to cooperatively engage with a second rabbet of an adjacent heat exchange unit and said second rabbet of said heat-exchange unit is configured to cooperatively engage a first rabbet of another adjacent heat exchange unit.

4. The heat-exchanger of claim 3, wherein said means for securing includes locking screws, said first rabbet of said heat exchange unit comprises at least one orifice for passage of a shank of one of said locking screws and said second rabbet said heat-exchange unit comprises tappings for receiving a threaded end of of another of said locking screws.

5. The heat-exchanger of claim 1, wherein said heat-exchange unit is formed by two opposing plates provided with grooves with zones for receiving said portions of said tubes therein, said plates being offset with respect to one another such that one of said opposite edges is formed by a first of said plates and the other of said opposite edges is formed by the other of said plates.

6. The heat-exchanger of claim 5, wherein portions of said plates which form said edges are each configured to form rabbetted borders.

7. The heat-exchanger of claim 6, wherein a first of said rabbetted borders of said heat-exchange unit is configured to cooperatively engage a second rabbetted border of an adjacent heat-exchange unit and a second of said rabbetted borders is configured to cooperatively engage a first rabbetted border of another adjacent heat-exchange unit.

8. The heat-exchanger of claim 7, wherein said first rabbetted border of said heat-exchange unit comprises at least one orifice for passage of a locking screw shank and said second rabbetted border of said heat-exchange unit comprises tappings for receiving a threaded end of another locking screw.

9. The heat-exchanger of claim 1, wherein said plate includes, on at least one of said front and rear faces, means for fixing electronic power components of various shapes and in variable numbers.

10. The heat-exchanger of claim 9, wherein said means for fixing are tappings distributed over at least one of said faces.

* * * * *